(12) United States Patent
Andou

(10) Patent No.: US 11,335,884 B2
(45) Date of Patent: May 17, 2022

(54) METHOD FOR MANUFACTURING DISPLAY DEVICE HAVING FLEXIBILITY

(71) Applicant: Japan Display Inc., Minato-ku (JP)

(72) Inventor: Naohisa Andou, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 52 days.

(21) Appl. No.: 16/902,492

(22) Filed: Jun. 16, 2020

(65) Prior Publication Data

US 2020/0381662 A1   Dec. 3, 2020

Related U.S. Application Data

(63) Continuation of application No. PCT/JP2018/046170, filed on Dec. 14, 2018.

(30) Foreign Application Priority Data

Jan. 10, 2018 (JP) .............................. JP2018-001821

(51) Int. Cl.
 *H01L 51/52* (2006.01)
 *H01L 51/00* (2006.01)
 *H01L 51/56* (2006.01)

(52) U.S. Cl.
 CPC ...... *H01L 51/5253* (2013.01); *H01L 51/0097* (2013.01); *H01L 51/56* (2013.01); *H01L 2251/5338* (2013.01)

(58) Field of Classification Search
 None
 See application file for complete search history.

(56) References Cited

U.S. PATENT DOCUMENTS

2017/0294621 A1* 10/2017 Higano ............... H01L 51/5281
2019/0363153 A1* 11/2019 Matsui .................. H05B 33/02

FOREIGN PATENT DOCUMENTS

JP   2006-322964 A   11/2006
JP   2017-187705 A   10/2017

OTHER PUBLICATIONS

International Search Report dated Mar. 19, 2019 in PCT/JP2018/046170 filed on Dec. 14, 2018, 2 pages.
Office Action dated Dec. 14, 2021, in Japanese Patent Application No. 2018-001821, (English Machine Translation).

* cited by examiner

Primary Examiner — J. E. Schoenholtz
(74) Attorney, Agent, or Firm — Oblon, McClelland, Maier & Neustadt, L.L.P.

(57) ABSTRACT

A display device comprises an organic EL substrate including an organic EL layer formed on a flexible substrate and a first main surface of the flexible substrate; a film covering a display region of the organic EL substrate; and a terminal region arranged at an end portion of the organic EL substrate, and arranged adjacent to and apart from an end portion of the film. The end portion of the film may have a taper region. A thickness of the taper region increases with distance from the terminal region in a cross-sectional view. A width of the taper region may be 0.5 times or more and 1.5 times or less of the film thickness in a plan view.

2 Claims, 9 Drawing Sheets

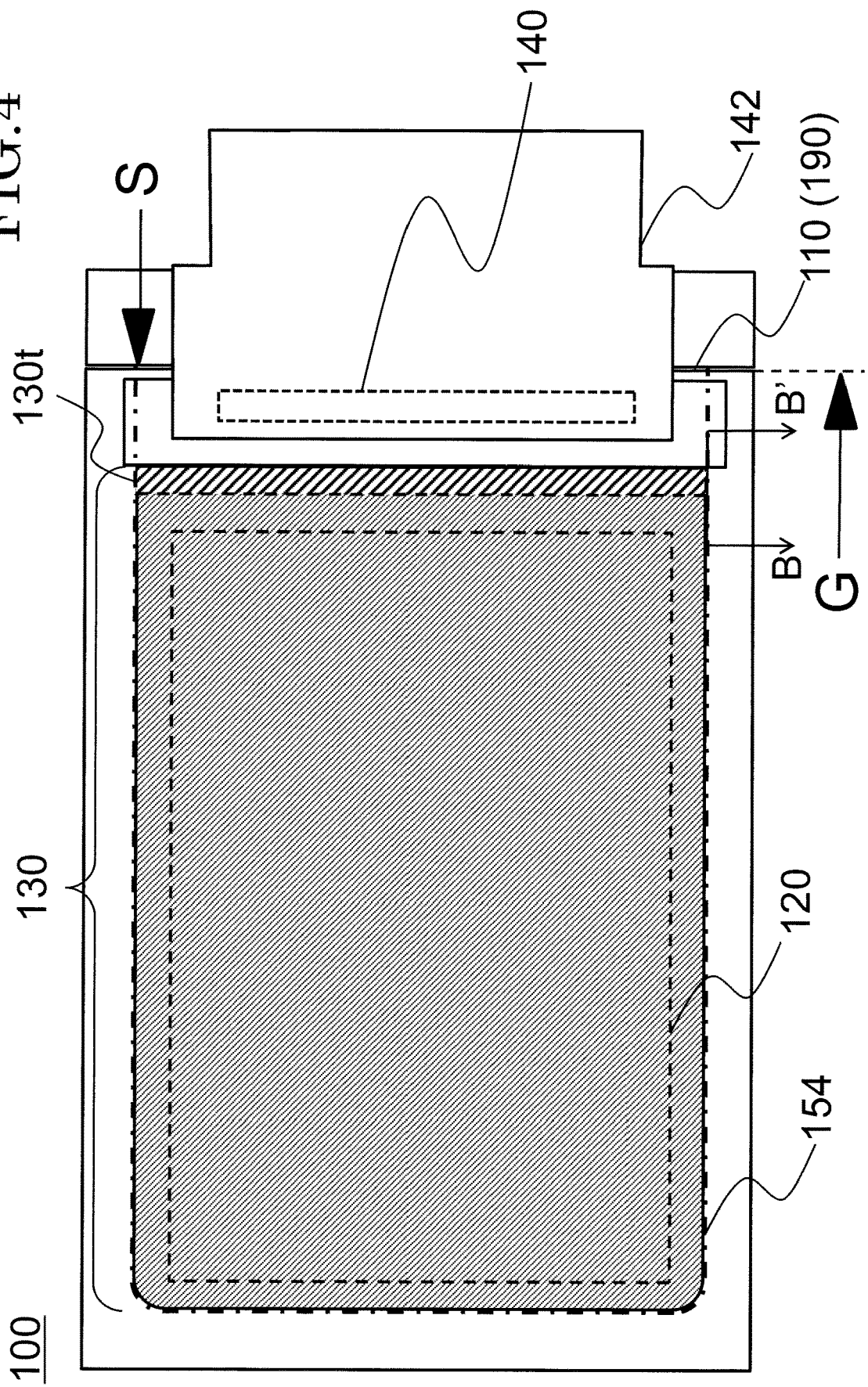

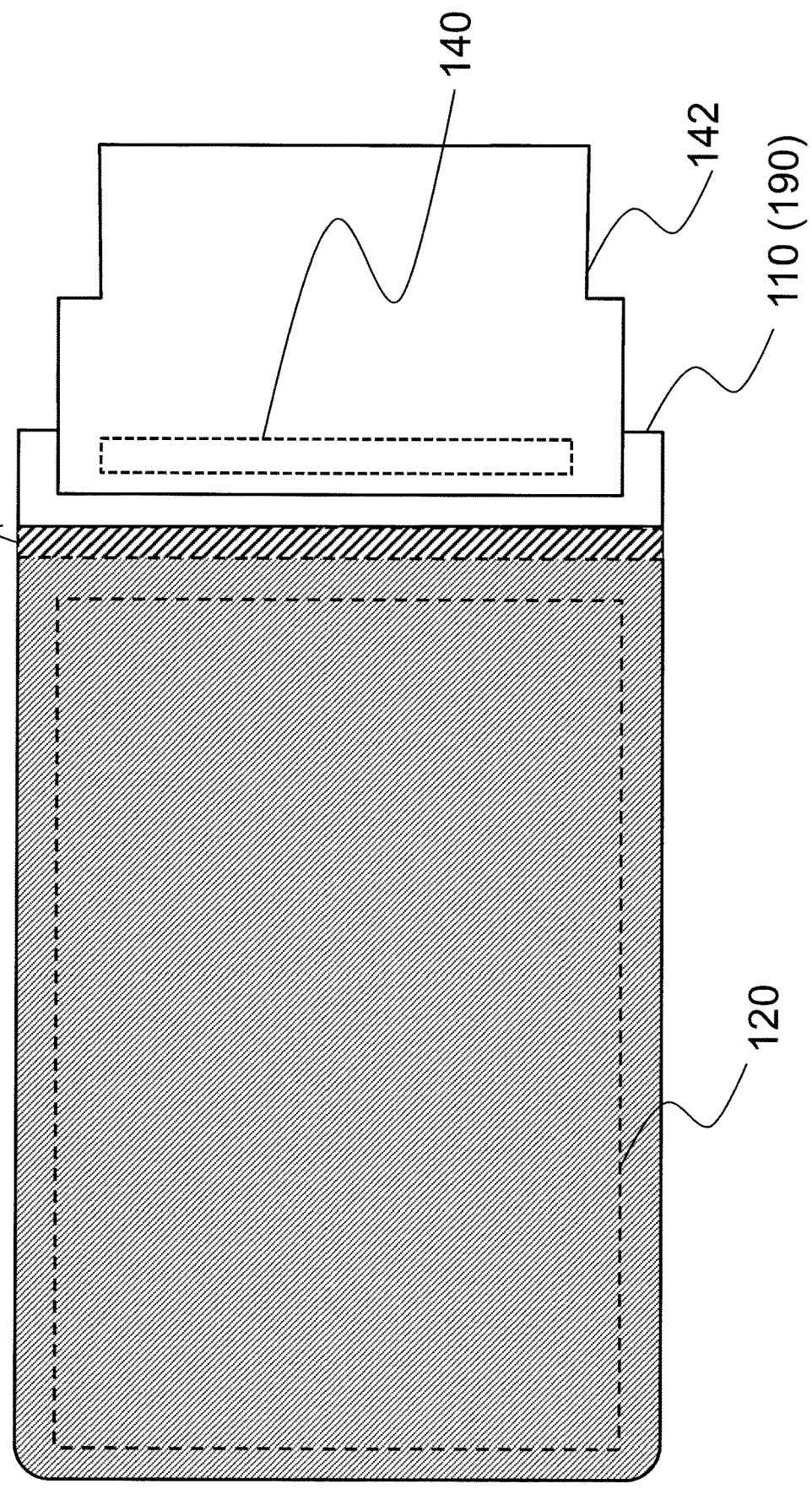

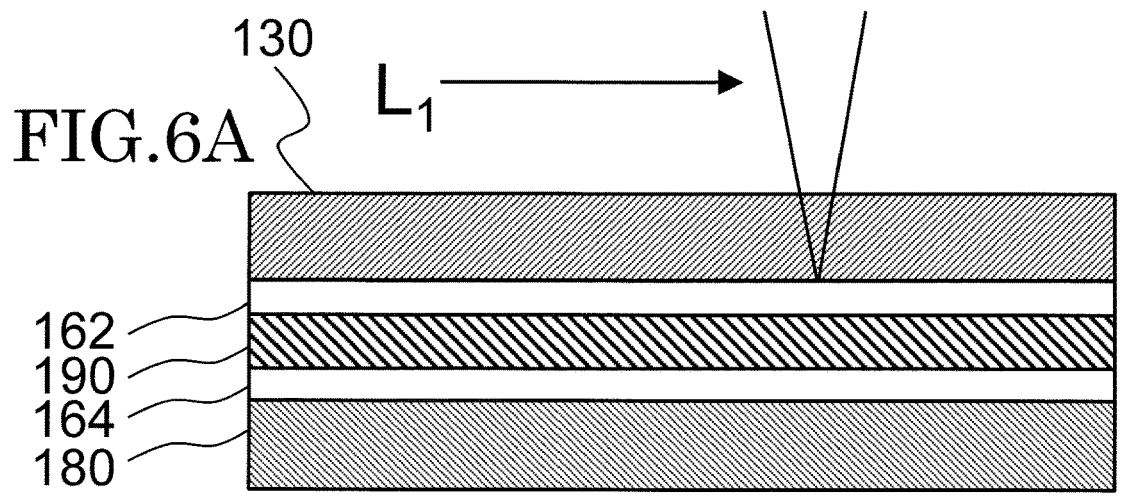
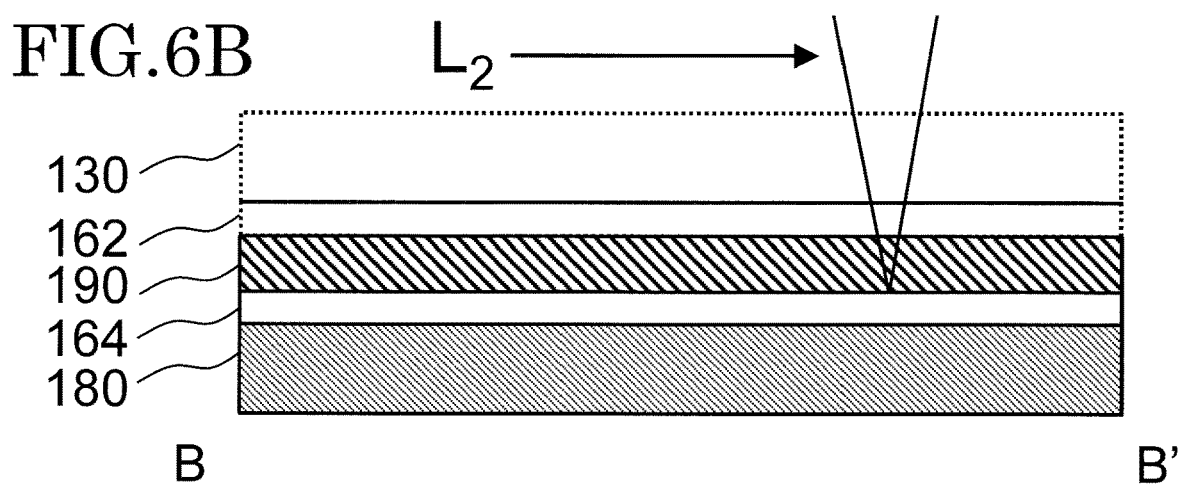
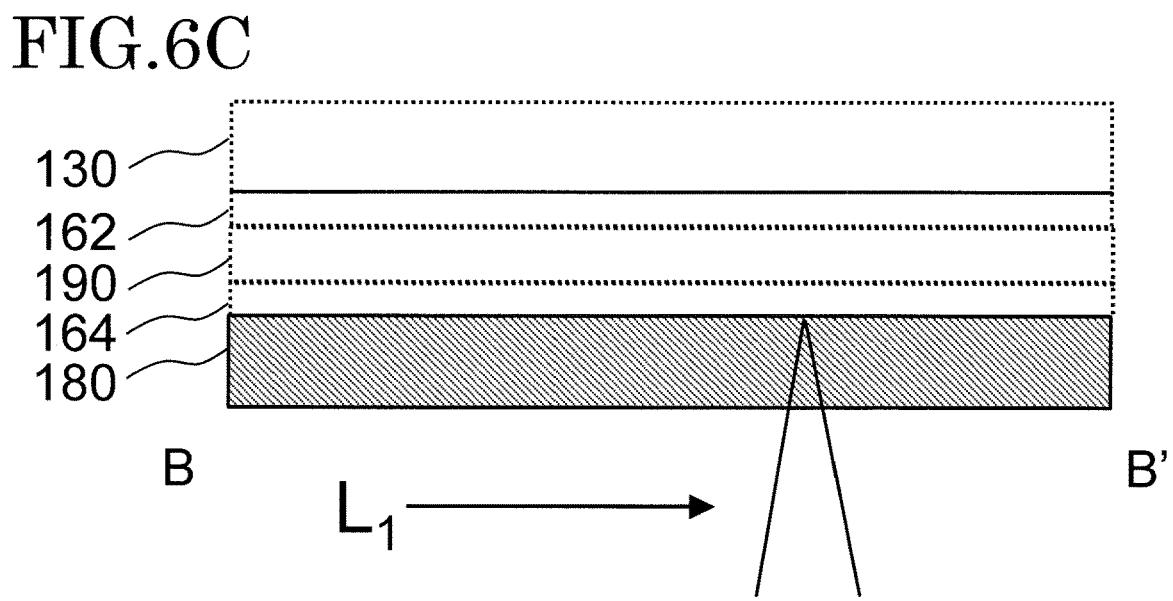

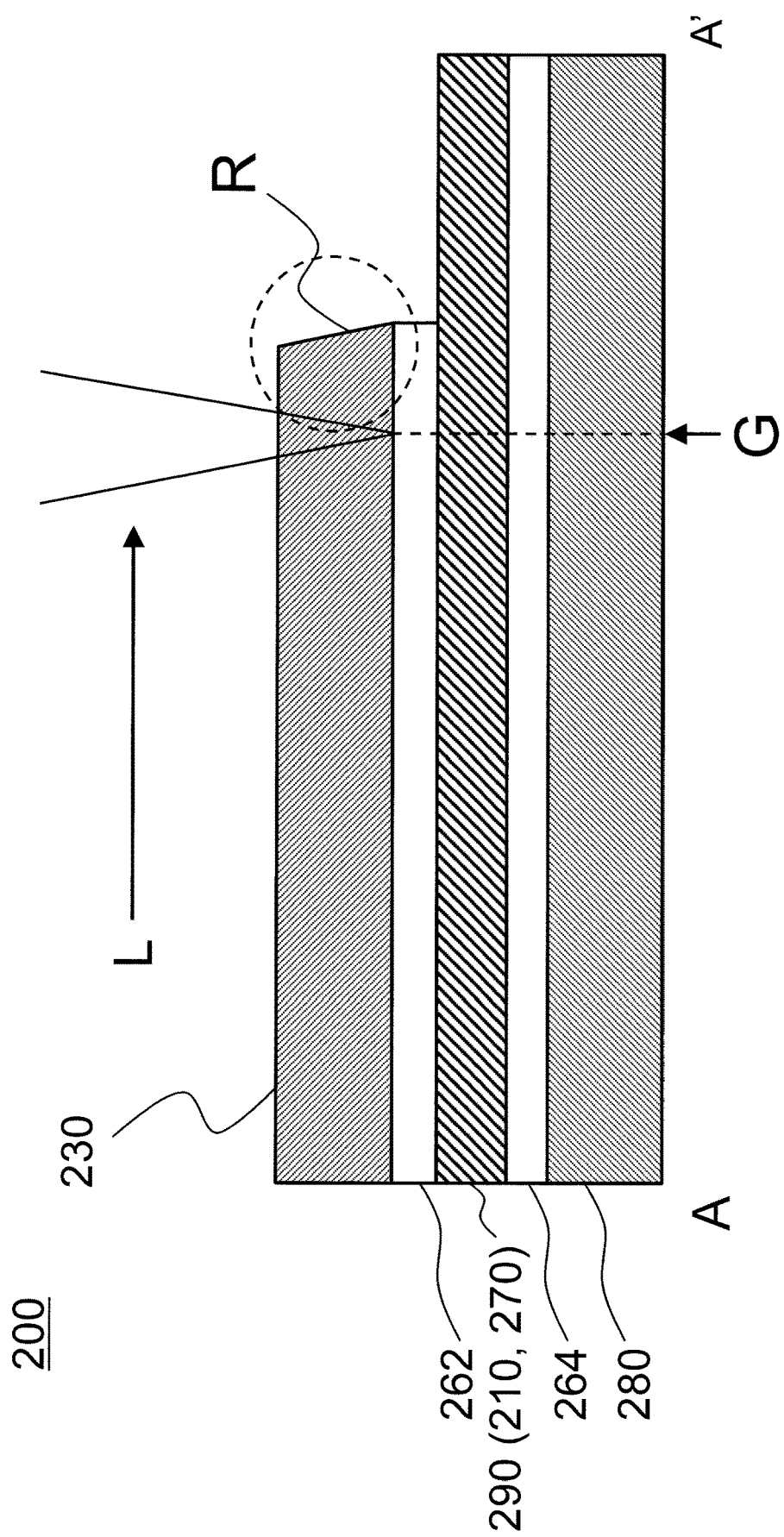

METHOD FOR MANUFACTURING DISPLAY DEVICE HAVING FLEXIBILITY

CROSS REFERENCE TO RELATED APPLICATIONS

This application is based on and claims the benefit of priority from the prior Japanese Patent Application No. 2018-001821, filed on Jan. 10, 2018, and PCT Application No. PCT/JP2018/046170 filed on Dec. 14, 2018, the entire contents of which are incorporated herein by reference.

FIELD

The present invention relates to a display device and a manufacturing method thereof. In particular, it relates to an organic EL display device having flexibility and a manufacturing method thereof.

BACKGROUND

A display device having a plurality of pixels formed on a substrate is known. Typical examples of such display device include a liquid crystal display device and an EL display device.

An EL display device is a display device with a light emitting element having a structure in which a material exhibiting electroluminescence (EL) phenomena is sandwiched between a pair of electrodes in each pixel. A light emitting element, which uses an organic compound as its material, is called an organic light emitting element, an organic EL element, or an organic electric field light emitting element. Such a display device having a plurality of organic light emitting elements is called an organic EL display device.

The organic EL display device has a plurality of organic light emitting elements (hereinafter referred to as a light emitting element) formed on a substrate. The organic EL display device displays images by controlling each light emitting element by a switching element such as a transistor. The substrate can include a glass substrate, a metallic substrate, and a ceramic substrate. By using the substrate having flexibility, for example, the substrate containing plastic resin (polycarbonate, polyethylene terephthalate, polyimide, polyacrylate, and the like), the organic EL display device having flexibility can be manufactured.

Japanese laid-open patent publication No. 2006-322964 discloses a liquid crystal display device comprising a polarizing film having a film-like polarizer, a high brightness film, a viewing angle improving film, or the like on a pair of substrates sandwiching a liquid crystal layer. A liquid crystal display device described in Japanese laid-open patent publication No. 2006-322964, in order to prevent peeling of the film, a thickness of an end portion of the polarizing film has a tapered shape that becomes thinner as it approaches an edge of the polarizing film.

SUMMARY

A display device according to an embodiment of the present invention comprises an organic EL substrate including a flexible substrate and an organic EL layer formed on a first main surface of the flexible substrate; a film covering a display region of the organic EL substrate; and a terminal region arranged at an end portion of the organic EL substrate, and arranged adjacent to and apart from an end portion of the film. The end portion of the film may have a taper region. A thickness of the taper region increases with distance from the terminal region in a cross-sectional view. A width of the taper region may be 0.5 times or more and 1.5 times or less of the film thickness in a plan view.

In the display device according to an embodiment of the present invention, the width of the taper region of the film may be 40 μm or more and 200 μm or less in a plan view.

In the display device according to an embodiment of the present invention, the taper region of the film may be located in a corner portion of the film in a plan view.

The display device according to an embodiment of the present invention comprises an organic EL substrate including a flexible substrate and an organic EL layer formed on a first main surface of the flexible substrate; a film covering a display region of the organic EL substrate; and a terminal region arranged at an end portion of the organic EL substrate, and arranged adjacent to and apart from an end portion of the film. The end portion of the film may have a step region having a thickness smaller than a thickness of the film.

In the display device according to an embodiment of the present invention, the thickness of the step region of the film may be 0.5 times or more and 0.8 times or less of the film thickness.

In the display device according to an embodiment of the present invention, the width of the step region of the film may be 40 μm or more and 200 μm or less from the end of the film in a plan view.

In the display device according to an embodiment of the present invention, the step region of the film may be located in a corner portion of the film in a plan view.

A method for manufacturing a display device according to an embodiment of the present invention comprises forming an organic EL substrate by forming an organic EL layer on a first main surface of a flexible substrate; forming a terminal region in an end portion of the organic EL substrate; covering a display region of the organic EL substrate with a film, cutting the film along a first cutting line by a first laser, and cutting the organic EL substrate along a second cutting line by a second laser. The film has a taper region. A thickness of the taper region increases with distance from the terminal region in a cross-sectional view. A cutting end position may be in a range of the taper region.

In the method for manufacturing a display device according to an embodiment of the present invention, a cutting start position of the film by the first laser may be in a range of the taper region.

A method for manufacturing a display device according to an embodiment of the present invention comprises forming an organic EL substrate by forming an organic EL layer on a first main surface of a flexible substrate; forming a terminal region in an end portion of the organic EL substrate; covering a display region of the organic EL substrate with a film, cutting the film along a first cutting line by a first laser, and cutting the organic EL substrate along a second cutting line by a second laser. The film has the step region. A thickness of the step region is smaller than the thickness of the film. A cutting end position may be in the range of the step region.

BRIEF DESCRIPTION OF DRAWINGS

FIG. 4 is a schematic top view showing a manufacturing process of a display device according to an embodiment of the present invention;

FIG. 5 is a schematic top view of a display device according to an embodiment of the present invention;

FIG. 6A, FIG. 6B, and FIG. 6C are cross-sectional schematic views showing manufacturing processes of a display device according to an embodiment of the present invention;

FIG. 9 is a cross-sectional schematic view showing a manufacturing process of a conventional display device.

DESCRIPTION OF EMBODIMENTS

Figure 1:
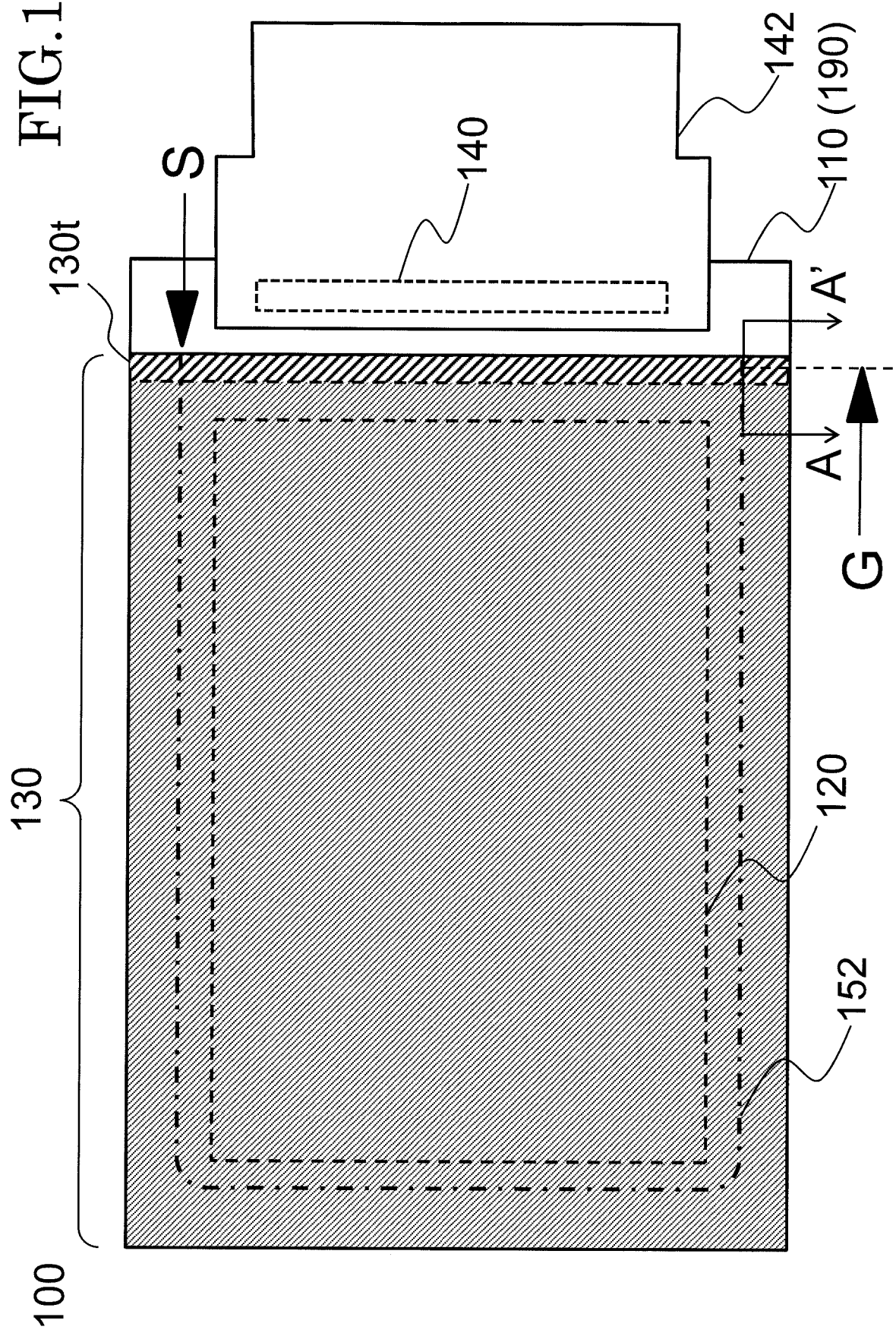
FIG. 1 is a schematic top view showing a manufacturing process of a display device according to an embodiment of the present invention.

It is an object of the present invention to provide a method for manufacturing a display device having a flexibility (for example, an organic EL display device having a flexibility) with a high yield and a method for manufacturing the display device of the same with a high yield. More specifically, it is an object of the present invention to provide a display device for providing a display device having a polarizing film on a front surface and a back surface of a substrate having a flexibility without excess polarizing film remaining on an end portion of the substrate. A display device formed on a mother glass is individually separated and then laser-irradiated to remove the extra polarizing film on a periphery of the mother glass for shaping it to the size of a final product. It is an object of the present invention to provide a technique that does not affect an inner structure of the display device and does not cause a remainder of the polarizing film to be cut when removing the polarizing film.

Embodiments of the present invention will be described below with reference to the drawings and the like. However, the present invention can be implemented in many different modes and should not be construed as being limited to the description of the following embodiments. For the sake of clarity of explanation, the drawings may schematically represent the width, thickness, shape, and the like of each portion in comparison with actual embodiments, but not intended to limit the interpretation of the present invention. In this specification and the drawings, the same elements as those in the drawings described above are denoted by the same reference numerals (or the reference numerals a, b, etc.) and a detailed description thereof may be omitted. In addition, the terms "first" and "second" to each element are convenient labels used to distinguish each element and have no further meaning unless otherwise stated.

In this specification, when a first member (or a first region) is "above (or below)" a second member (or a second region), unless otherwise limited, the first member includes not only being directly above (or below) the second member, but also being above (or below) the second member via a third member (or a third region). That is, this includes cases where another component is included between the first member and the second member. In the following description, unless otherwise limited, in a cross-sectional view, a main surface on which a display region is placed of the two main surfaces of the substrate is described as the upper side.

First Embodiment

FIG. 1 is a schematic top view showing a manufacturing process of a display device 100 according to the first embodiment. The display device 100 has a flexible substrate 110 and a display region 120 provided on the flexible substrate 110. As will be described later, an organic EL layer 170 (see FIG. 2) including a plurality of pixels and the like is formed on the main surface of the flexible substrate 110. The display region 120 consists of several pixels. In this specification, the flexible substrate 110 and the organic EL layer 170 provided thereon may be collectively referred to as an organic EL substrate 190.

The display device 100 may have a connector 142 on the main surface of the flexible substrate 110 on which the display region 120 is formed (hereinafter referred to as "a first main surface") that overlap the flexible substrate 110. An IC (Integrated Circuit) chip (not shown) may be provided between the connector 142 and the display region 120.

On a side end portion on the main surface of the flexible substrate 110, a terminal region 140 comprising a plurality of terminals formed. The connector 142 electrically connects to the plurality of terminals of the terminal region 140. A plurality of wirings (not shown) is placed from the display region 120 toward the end portion of the flexible substrate 110. The plurality of wirings is electrically connected to the display region 120 and the IC chip described above. A part of this wiring is exposed in the terminal region 140 and the exposed part functions as multiple terminals. The plurality of terminals may be connected to the connector 142 at the terminal region 140 by a conductive film, such as an anisotropic conductive film.

The display region 120 of the organic EL substrate 190 is further covered with a first film 130. The first film 130 does not cover the entire first main surface, which is the front surface of the organic EL substrate 190, but covers a portion of the first main surface of the organic EL substrate 190 so as to expose the terminal region 140. That is, one end portion of the first film 130 is present at a position apart from the terminal region 140 formed in the end portion on the flexible substrate 110.

A back surface of the organic EL substrate 190 (another main surface facing the first main surface; hereinafter referred to as "second main surface") may be covered with a second film 180 (see FIG. 2, etc.). The first film 130 and the second film 180 may be, for example, a polarizing film, a high brightness film, a viewing angle improving film, or a multi-functional film having a plurality of optical functions. The polarizing film may be a film substrate formed as a polarization plate containing polarizer. For example, the polarization plate is constructed with polarizer that exhibit circular polarization. By providing the polarizing film overlapped a pixel part, it is possible to prevent a person or the like from being mirrored on the display screen.

The display region 120 of the organic EL layer 170 is provided with a plurality of pixels (not shown) for displaying images. Each pixel is provided with a display element and one or more transistor electrically connected to the display element. Each of the display element is controlled by the transistor. Each pixel is electrically connected to the IC chip and is driven in response to an externally input video signal through the terminal of the connector 142 and the terminal region 140. The connector 142 is, for example, a flexible printed circuit (FPC) substrate or the like is used. However, the present invention is not limited thereto, without using the separated connector 142 and the flexible substrate 110, an electric circuit for external connection to a part of the flexible substrate 110 may be integrally formed.

As the above-mentioned display element, for example, an organic EL light emitting element is used. The organic EL light emitting element can have different emission colors by using different organic EL materials. The display region 120 may be formed using the plurality of light emitting elements that provide differing emission colors. Alternatively, a white light emitting element may be used to form the display region 120 and a color filter may be used to extract a desired emission color from the light emitting element.

The IC chip is fabricated using, for example, a semiconductor substrate. The IC chip is fixed on the flexible substrate 110 or on the connector 142 and functions as a driving circuit that controls the transistors of the respective pixels. Other driving circuits may be further provided around the display region 120. Alternatively, the IC chip may not be provided, and the driving circuit may be provided around the display region 120.

The flexible substrate 110 is formed of a member having a flexibility such as plastic resin (polycarbonate, polyethylene terephthalate, polyimide, polyacrylate, or the like). When the material of the substrate is plastics resin or the like, flexibility can be applied to the display device 100 by thinning the substrate. By using the flexible substrate 110 as the substrate, a flexible display can be provided. For example, a polymeric film such as polyimide can be used as the flexible substrate 110. As the flexible substrate 110, it is preferable to use a polymer film that can effectively absorb the laser beam from a second laser $L_2$, which will be described later. It is also preferable to use a polymer film that is less permeable to water, oxygen, and the like as the flexible substrate 110. The flexible substrate 110 may be formed, for example, by applying solutions or mixtures containing polymeric materials and then heating them. The flexible substrate 110 may be formed by applying solutions or mixtures containing precursors of polymeric materials and polymerizing them by heating. The flexible substrate 110 may be formed by placing a film-like polymer film on a support substrate and applying pressure.

The display device 100 shown in FIG. 1 is showing a state of being divided or separated into individual display devices after a plurality of display devices have been produced collectively (state before shaping to the final product size). Thus, the flexible substrate 110 of the display device 100 shown in FIG. 1 has an outer circumference that is one size larger than the final product size (see FIG. 5). The display device 100 shown in FIG. 1, in the next step, a laser is irradiated along a first cutting line 152. As a result, the first film 130 is cut and removed. A cutting start position S and a cutting end position G in the cutting process of the first film 130 by laser irradiation is shown in FIG. 1.

Figure 2:
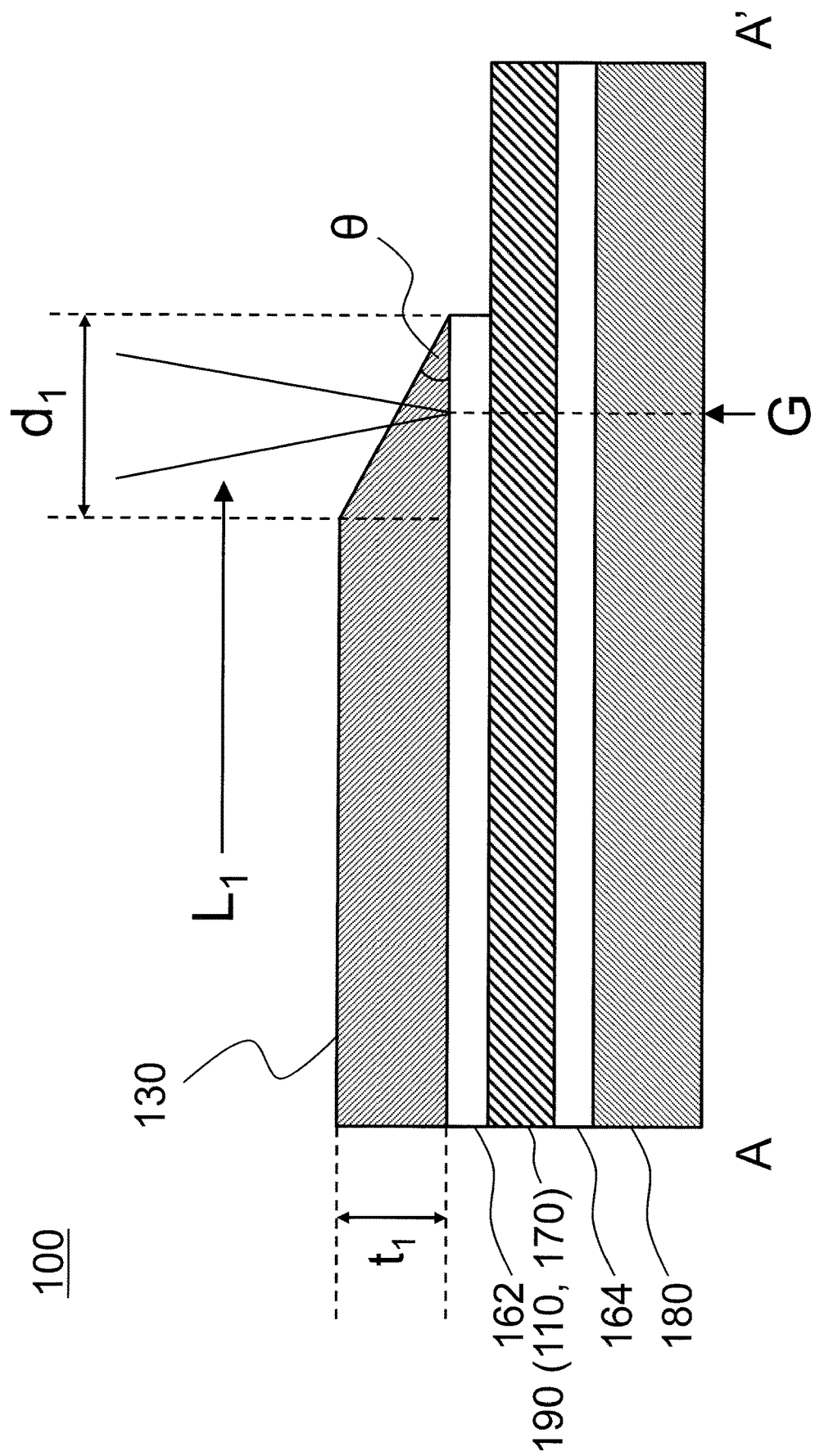
FIG. 2 is a cross-sectional schematic view cut by A-A' of FIG. 1 showing a manufacturing process of a display device according to an embodiment of the present invention.

FIG. 2 is a cross-sectional schematic view cut by A-A' of FIG. 1 showing the manufacturing process of the display device 100 according to an embodiment of the present invention. In the manufacturing process of the display device 100 shown in FIG. 2, the first film 130 is cut by irradiating a first laser $L_1$ along the first cutting line 152 shown in FIG. 1. The laser irradiation by the first laser $L_1$ is continuously performed from the cutting start position S to the cutting end position G shown in FIG. 1. As a result, the first film 130 on the outer side of the first cutting line 152 is removed. FIG. 2 is an enlarged view showing the structure of the first film 130 in the vicinity of the cutting end position G by the first laser $L_1$ in the cross section cut by A-A' shown in FIG. 1.

As shown in FIG. 2, in a cross-sectional view of the display device 100, the first film 130 is adhered to a front side of the organic EL substrate 190 including the flexible substrate 110 and the organic EL layer 170 provided thereon through a first adhesive layer 162. The second film 180 is adhered to a back side of the organic EL substrate 190 via a second adhesive layer 164. Here, the "front side" of the organic EL substrate 190 refers to the first main surface side in which the display region 120 is provided in the flexible substrate 110. The "back side" of the organic EL substrate 190 refers to the other main surface side (the second main surface side) facing the first main surface on which the display region 120 is provided in the flexible substrate 110.

As shown in FIG. 2, in the end portion of the first film 130, in a cross-sectional view, a taper region 130t of which the thickness is increasing as the distance from the terminal region 140 shown in FIG. 1 is formed. A taper angle θ of the taper region 130t of the first film 130 is defined by a ratio of a thickness $t_1$, which is the film thickness of the first film 130 and a width $d_1$ of the taper region 130t in a plan view.

The width $d_1$ of the taper region 130t of the first film 130 may be about 1.2 times, preferably 0.5 times or more and 2 times or less, more preferably 0.5 times or more and 1.5 times or less in a plan view, in the thickness $t_1$ which is the film thickness of the first film 130.

The width $d_1$ of the taper region 130t of the first film 130 may be 40 μm or more and 200 μm or less from the edge of the first film 130 adjacent to the terminal region 140 in a plan view. In FIG. 1, an example that the taper region 130t is formed within a certain width on the whole end portion of the first film 130 adjacent to the terminal region 140 is described, but not limited to this. It suffices that the taper region 130t in the present embodiment is formed at least in a region corresponding to the cutting end position G on the first cutting line 152. The taper region 130t in the present embodiment may be further formed in a region corresponding to the cutting start position S on the first cutting line 152. For example, the taper region 130t in the present embodiment may be formed on at least one corner portion of the first film 130 including the region corresponding to the cutting end position G or the cutting start position S on the first cutting line 152.

The process of forming the taper region 130t on the end portion of the first film 130 can be performed using any methods such as, for example, cutting the end portion of the first film 130 with a blade (sword) inclined by a predetermined taper angle θ, or cutting by a pre-set laser irradiation so as to a cutting surface have the predetermined taper angle θ.

The process of forming the taper region 130t on the end portion of the first film 130 is preferably performed prior to the process of adhering the first film 130 to the display region 120 side of the organic EL substrate 190 via the first adhesive layer 162. When the taper region 130t is formed by adhering the first film 130 to the organic EL substrate 190, the organic EL layer 170 including a pixel such as the display element or the transistor may be physically pressurized or heated. In the present embodiment, by forming the taper region 130t in advance on the end portion of the first film 130, the above-described effects can be avoided.

The type and wavelength of the first laser $L_1$ are not particularly limited, and a laser having wavelength that can be absorbed by the first film 130 irradiated with the laser may be used. The first laser $L_1$ may be, for example, carbon dioxide laser ($CO_2$ laser) having wavelength band of about 9.3 μm or more and 9.6 μm or less. Alternatively, for example, gas laser such as excimer laser, solid-state laser such as YAG laser, semiconductor laser, dye laser, or the like can be used. Although a beam cross-section of the laser may be dotted or linear, the use of laser having a linear beam cross-section is preferred for shortening the irradiation time.

As shown in FIG. 2, the cutting end position G of the first laser $L_1$ is located within the range of the width $d_1$ of the taper region 130$t$. That is, the cutting end position G of the first film 130 by the first laser $L_1$ is located inside the end of the first film 130. In this specification, the "inside" of the first film 130 refers to the direction of the point A as viewed from the point A' in FIG. 2. In other words, "inside" of the first film 130 refers to the direction of the display region 120 as viewed from the taper region 130$t$ in FIG. 1.

The reason why the laser irradiation by the first laser $L_1$ is not performed up to the end of the first film 130 is to prevent the laser irradiation by the first laser $L_1$ from being performed on the organic EL substrate 190 located in the lower layer of the first film 130. The flexible substrate 110 included in the organic EL substrate 190 is formed of, for example, a polyimide-containing material, and the organic EL layer 170 including a plurality of pixels including the display element or the like is provided thereon. Therefore, these inner structures must be protected from laser exposure by the first laser $L_1$. Therefore, it is preferable that the end position of the laser irradiation by the first laser $L_1$ in the end portion of the first film 130 is slightly inward from the end of the first film 130 so that the first laser $L_1$ is not directly irradiated on the organic EL substrate 190 in view of the laser spot diameter, power, and the like.

FIG. 9 is a diagram showing a manufacturing process of a conventional display device 200. Specifically, FIG. 9 is a schematic view for explaining a cross section corresponding to the cross section cut by A-A' of the display device 100 shown in FIG. In FIG. 9, symbol 290 is an organic EL substrate, and the organic EL substrate 290 includes a flexible substrate 210 and an organic EL layer 270 formed thereon. The first film 230 is adhered to a front side (main surface side on which the display region is formed) of the organic EL substrate 290 via a first adhesive layer 262. A second film 280 is adhered to a back side of the organic EL substrate 290 (the other main surface side facing the main surface on which the display region is formed) via a second adhesive layer 264.

In the conventional display device 200 shown in FIG. 9, simply by stopping the laser irradiation by the laser L inside the end of the first film 230, closer to the end than the cutting end position G, a remaining R of the first film 230 may occur. Consequently, when shaping the display device 200 to the final product size, there is a problem that the yield is reduced.

In the present embodiment, by setting the cutting end position G of the first laser $L_1$ to be within the width $d_1$ of the taper region 130$t$, the laser beam by the first laser $L_1$ can be stopped slightly inside the edge of the first film 130. In the display device 100 according to the present embodiment, when the laser irradiation by the first laser $L_1$ is stopped within the range of the width $d_1$ of the taper region 130$t$, the first film 130 located outside the cutting end position G is a tapered shape gradually smaller as it approaches the end. Therefore, the thickness of the part where the first laser $L_1$ is not irradiated is sufficiently small, and the part can be removed to the end of the first film 130 by the residual heat of the laser irradiation of the first laser $L_1$ at the cutting end position G or the like.

Therefore, according to the present embodiment, the organic EL substrate 190 located under the first film 130 is not irradiated with the first laser $L_1$. It is possible to prevent the first film 130 from remaining at the outer side of the cutting end position G by the first laser $L_1$. As a result, according to the present embodiment, the effect that the yield is improved when shaping the display device to the final product size.

Second Embodiment

Figure 3:
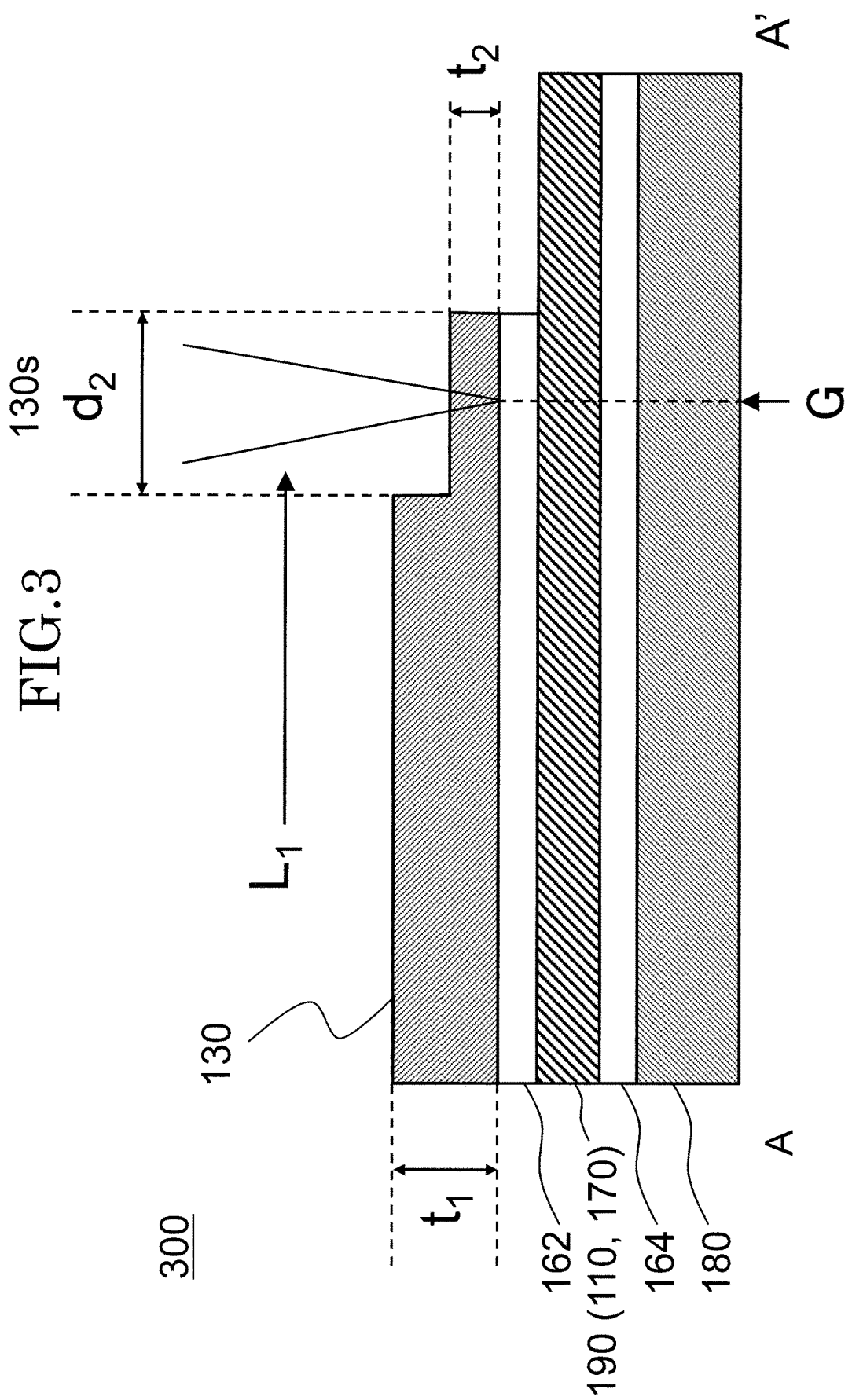
FIG. 3 is a cross-sectional schematic view corresponding to a cross-section cut by A-A' of FIG. 1 showing a manufacturing process of a display device according to an embodiment of the present invention.

FIG. 3 is a cross-sectional schematic view showing a manufacturing process of a display device 300 according to the second embodiment. The display device 300 has the flexible substrate 110 and the display region 120 provided on the flexible substrate 110. On the first main surface of the flexible substrate 110, the organic EL layer 170 including a plurality of pixels or the like is formed.

The display device 300 according to the second embodiment differs from the display device 100 according to the first embodiment in that a region formed on the end portion of the first film 130 is a step region 130$s$ instead of the taper region 130$t$, and the other configurations are the same.

The display region 120 of the organic EL substrate 190 is further covered with the first film 130. The back side of the organic EL substrate 190 may be covered with the second film 180. The first film 130 and the second film 180 may be, for example, polarizing film, a high brightness film, a viewing angle improving film, or a multi-functional film having a plurality of optical functions. The polarizing film may be the film substrate formed as the polarization plate containing polarizer. For example, the polarization plate is constructed with polarizer that exhibit circular polarization. By providing the polarizing film overlapped the pixel part, it is possible to prevent a person or the like from being mirrored on the display screen.

FIG. 3 is a diagram corresponding to a cross-sectional view in a cross section cut by A-A' of the display device 100 according to the first embodiment. In the manufacturing process of the display device 300 shown in FIG. 3, the first film 130 is cut by irradiating the first laser $L_1$ along the first cutting line 152 shown in FIG. 1. The laser irradiation by the first laser $L_1$ is continuously performed from the cutting start position S to the cutting end position G shown in FIG. 1. As a result, the first film 130 on the outer side of the first cutting line 152 is removed. FIG. 3 is an enlarged view showing the structure of the first film 130 in the vicinity of the cutting end position G by the first laser $L_1$ in the cross section cut by A-A' shown in FIG. 1.

As shown in FIG. 3, the display device 300 has, in cross-sectional view, the organic EL substrate 190 that includes the flexible substrate 110 and the organic EL layer 170 disposed thereon. The first film 130 is adhered to the front side of the organic EL substrate 190 via the first adhesive layer 162. The second film 180 is adhered to the back side of the organic EL substrate 190 via the second adhesive layer 164.

As shown in FIG. 3, in the end portion of the first film 130, the step region 130$s$ having a thickness $t_2$ less than the thickness $t_1$ of the first film 130 is formed. The thickness $t_2$ of the step region 130$s$ of the first film 130 may be about 0.5 times, preferably 0.5 times or more and 0.8 times or less, of the thickness $t_1$ which is the thickness of the first film 130.

A width $d_2$ of the step region 130s of the first film may be 40 μm or more and 200 μm or less from the edge of the first film 130 adjacent to the terminal region 140 in a plan view. The step region 130s may be formed over the entire end portion of the first film 130 adjacent to the terminal region 140 but not limited thereto. It suffices that the step region 130s in the present embodiment is formed at least in the region corresponding to the cutting end position G on the first cutting line 152. The step region 130s in the present embodiment may be further formed in the region corresponding to the cutting start position S on the first cutting line 152. For example, the step region 130s in the present embodiment may be formed on at least one corner portion of the first film 130 including the region corresponding to the cutting end position G or the cutting start position S on the first cutting line 152.

The process of forming the step region 130s on the end portion of the first film 130 can be performed using any methods such as, for example, thinning the end portion of the first film 130 with a blade or chemically polishing it to the predetermined thickness $t_2$.

The process of forming the step region 130s on the end portion of the first film 130 is preferably performed prior to the process of adhering the first film 130 to the display region 120 side of the organic EL substrate 190 via the first adhesive layer 162. When the step region 130s is formed by adhering the first film 130 to the organic EL substrate 190, the organic EL layer 170 including a pixel such as the display element or the transistor may be physically pressurized or heated. In the present embodiment, by forming the step region 130s in advance on the end portion of the first film 130, the above-described effects can be avoided.

As shown in FIG. 3, the cutting end position G of the first laser $L_1$ is located within the range of the width $d_2$ of the step region 130s. That is, the cutting end position G of the first film 130 by the first laser $L_1$ is located inside the end of the first film 130. The reason why the laser irradiation by the first laser $L_1$ is not performed up to the end of the first film 130 is to prevent the laser irradiation by the first laser $L_1$ from being performed on the organic EL substrate 190 located in the lower layer of the first film 130. The flexible substrate 110 is formed of, for example, a polyimide-containing material, and a plurality of pixels including the display element and the like is provided on the organic EL layer 170. Therefore, these inner structures must be protected from laser exposure by the first laser $L_1$. Therefore, it is preferable that the end position G of the laser irradiation by the first laser $L_1$ in the end portion of the first film 130 is slightly inward from the end of the first film 130 so that the first laser $L_1$ is not directly irradiated on the organic EL substrate 190 in view of the laser spot diameter, power, and the like.

In the present embodiment, by setting the cutting end position G of the first laser $L_1$ to be within the width $d_2$ of the step region 130s, the laser beam by the first laser $L_1$ can be stopped slightly inside the edge of the first film 130. In the display device 300 according to the present embodiment, when the laser irradiation by the first laser $L_1$ is stopped within the range of the width $d_2$ of the step region 130s, the end portion of the first film 130 located on the outer side of the cutting end position G is smaller in thickness than the film thickness of the first film 130. Therefore, the film thickness of the part where the first laser $L_1$ is not irradiated is sufficiently small, and the part can be removed to the end of the first film 130 by the residual heat of the laser irradiation of the first laser $L_1$ at the cutting end position G.

Therefore, according to the present embodiment, the organic EL substrate 190 located under the first film 130 is not irradiated with the first laser $L_1$. It is possible to prevent the first film 130 from remaining at the outer side of the cutting end position G by the first laser $L_1$. As a result, according to the present embodiment, the effect that the yield is improved when shaping the display device to the final product size.

Since the other configurations are the same as those of the first embodiment, duplicated descriptions are omitted.

[Manufacturing Method]

Referring to FIGS. 1, 4, 5, FIGS. 6A to 6C, FIGS. 7A to 7C, and FIGS. 8A and 8B, methods for manufacturing the display devices 100 and 300 will be described. Hereinafter, among the manufacturing methods of the display devices 100 and 300 according to the present invention, the process from manufacturing a plurality of display devices collectively and then dividing or separating them into individual display devices to shaping them into final product size will be described.

As described above, FIG. 1 shows a state of being divided or separated into individual display devices after a plurality of display devices have been manufactured collectively (state before shaping it to the final product size). FIG. 4 shows the state that the first film 130 is irradiated with the first laser $L_1$ along the first cutting line 152 shown in FIG. 1 to cut and remove the excess first film 130 located on the outer periphery of the final product size. FIG. 5 shows the display device 100 with the extra flexible substrate 110 (the organic EL substrate 190) and the second film 180 located on the outer periphery of the final product size are cut and removed (i.e., shaped to the final product size) by irradiating the second laser $L_2$ or the like along a second cutting line 154 shown in FIG. 4. FIG. 4 shows the cutting start position S and the cutting end position G when performing the cutting process by laser irradiation along the second cutting line 154.

FIGS. 6A to 6C, FIGS. 7A to 7C, and FIGS. 8A and 8B show examples of the process of shaping the display device, which has been divided or separated into individual devices, into the final product size. FIGS. 6A to 6C, FIGS. 7A to 7C, and FIGS. 8A and 8B are cross-sectional schematic views showing the manufacturing process of the display device according to an embodiment of the present invention. FIGS. 6A to 6C, FIGS. 7A to 7C, and FIGS. 8A and 8B are both partial cross-sectional view of the display device in the cutting surface by the laser, arrows in the figures indicate traveling directions of the laser.

Examples of the first process shown in FIG. 6A to FIG. 6C will be described. First, as shown in FIG. 6A, the first laser $L_1$ is irradiated from the first film 130 side to cut the first film 130 (step A). The cutting position of the first film 130 is on the first cutting line 152 shown in FIG. 1. The cutting direction of the first film 130 is from the cutting start position S to the cutting end position G shown in FIG. 1.

As described above, the cutting end position G of the first film 130 is located within the region of the taper region 130t (see FIG. 2) slightly inside the edge of the first film 130, or the step region 130s (see FIG. 3). When the cutting process shown in the FIG. 6A is completed, the excess first film 130 located on the outer side of the first cutting line 152 is completely removed.

Next, as shown in FIG. 6B, the second laser $L_2$ is irradiated from the display region 120 side of the organic EL substrate 190 to cut the organic EL substrate 190 (step B). The organic EL substrate 190 includes the flexible substrate 110 and the organic EL layer 170 formed thereon. The cutting position of the organic EL substrate 190 is on the second cutting line 154 shown in FIG. 4. The cutting direction of the organic EL substrate 190 is from the cutting start position S to the cutting end position G shown in FIG. 4.

The type and wavelength of the second laser $L_2$ are not particularly limited, and laser having wavelength that can be absorbed by the organic EL substrate 190 irradiated with the laser may be used. However, since the organic EL substrate 190 has the inner structure such as the display element, the laser that these inner structures are not affected by the laser irradiation should be selected. The second laser $L_2$ may be, for example, ultraviolet laser (UV laser), which is less affected by thermal stress. Although the beam cross section of the laser may be dotted or linear, the use of laser having the linear beam cross section is preferred for shortening the irradiation time.

When the cutting process shown in FIG. 6B is completed, the excess organic EL substrate 190 located on the outer side of the second cutting line 154 is removed.

Next, as shown in FIG. 6C, the first laser $L_1$ is irradiated from the second film 180 side to cut the second film 180 (step C). The cutting position of the second film 180 is on the second cutting line 154 shown in FIG. 4. The cutting direction of the second film 180 is from the cutting start position S to the cutting end position G shown in FIG. 4.

The type and wavelength of the laser for cutting the second film 180 is not particularly limited, and a laser having wavelength that can be absorbed by the first film 180 irradiated with the laser may be used. For example, the carbon dioxide laser (the $CO_2$ laser) having wavelength band of about 9.3 μm or more and 9.6 μm or less may be used. Alternatively, for example, gas laser such as excimer laser, solid-state laser such as YAG laser, semiconductor laser, dye laser, or the like can be used. Although the beam cross section of the laser may be dotted or linear, the use of the laser having a linear beam cross section is preferred for shortening the irradiation time. As shown in FIG. 6C, the laser for cutting the second film 180 may be the same laser as the first laser $L_1$ used for cutting the first film 130.

When the cutting process shown in FIG. 6C is completed, the excess second film 180 located on the outer side of the second cutting line 154 is removed, resulting in the final product-sized display device 100 shown in FIG. 5.

Next, examples of the second process shown in FIG. 7A to FIG. 7C will be described. In the second process example, the process order of the process B and the process C in the first process example is reversed.

Figure 7A:
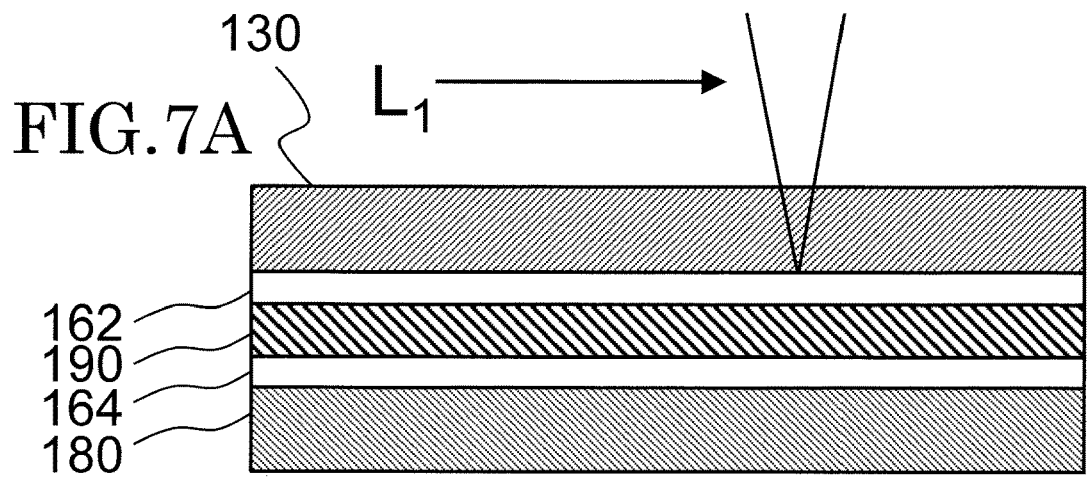
FIG. 7A, FIG. 7B, and FIG. 7C are cross-sectional schematic views showing manufacturing processes of a display device according to an embodiment of the present invention.

First, as shown in FIG. 7A, the first laser $L_1$ is irradiated from the second film 180 side to cut the second film 180. Since the process shown in FIG. 7A is the same as the process shown in FIG. 6A, repetitive descriptions are omitted.

Figure 7B:
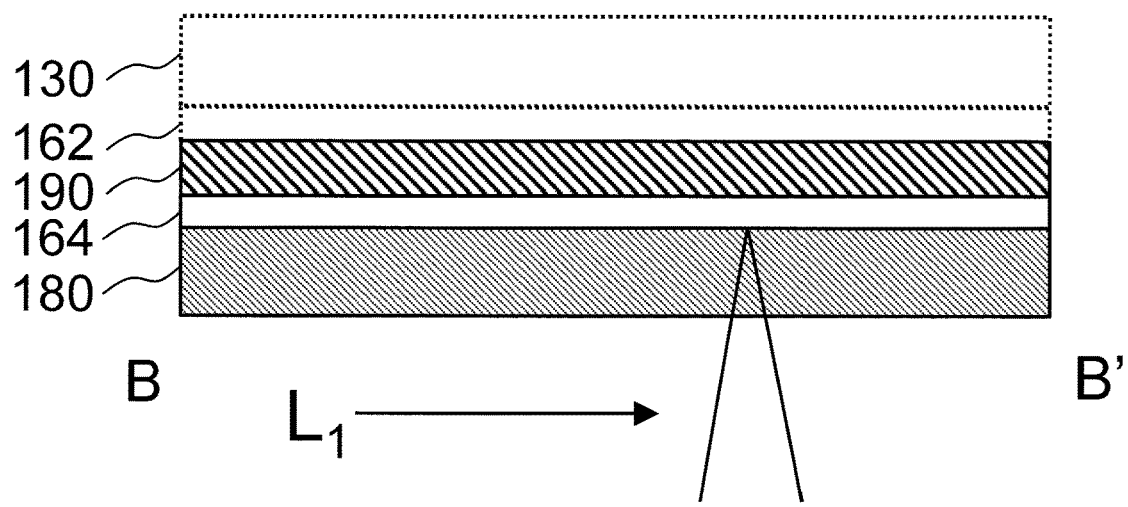

Next, as shown in FIG. 7B, the first laser $L_1$ is irradiated from the second film 180 side to cut the second film 180. The process of cutting the second film 180 shown in FIG. 7B is the same as the process shown in FIG. 6C except that the organic EL substrate 190 remains without excision on the second film 180 via the second adhesive layer 164 at the outer periphery of the second cutting line 154.

Figure 7C:
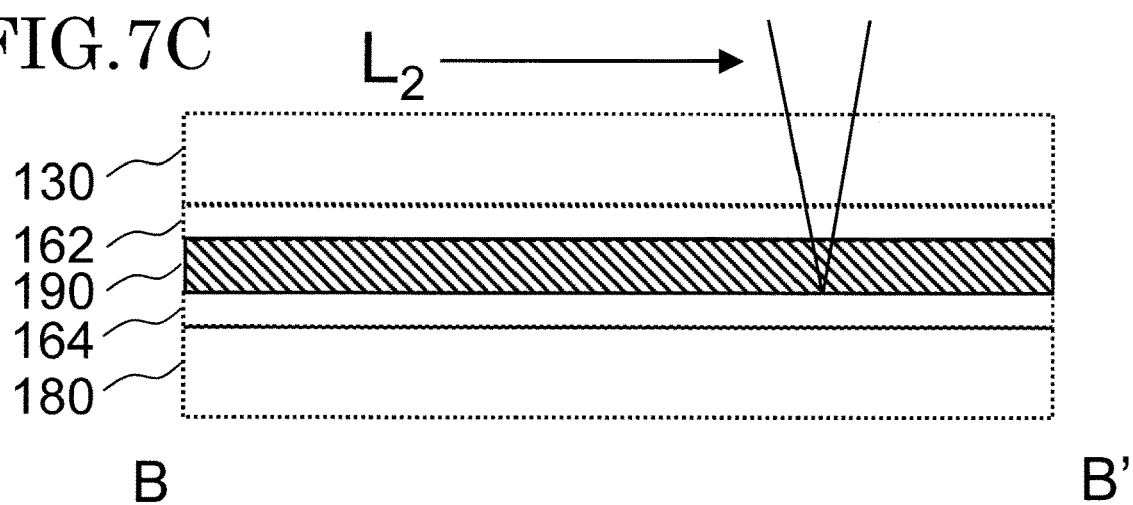

Next, as shown in FIG. 7C, the second laser $L_2$ is irradiated from the display region 120 side of the organic EL substrate 190 to cut the organic EL substrate 190. The process of cutting the organic EL substrate 190 shown in FIG. 7C is the same as the process shown in FIG. 6B except that the second film 180 has already been cut off on the outer periphery of the second cutting line 154.

When the cutting process shown in FIG. 7C is completed, the extra organic EL substrate 190 located on the outer side of the second cutting line 154 is removed, resulting in the final product-sized display device 100 shown in FIG. 5.

Figure 8A:
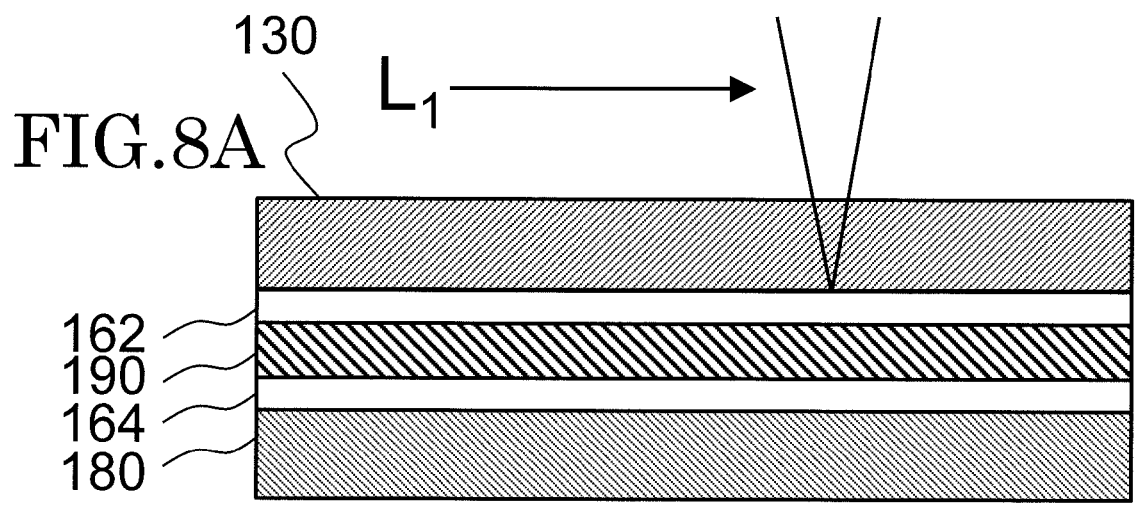
FIG. 8A and FIG. 8B are cross-sectional schematic views showing manufacturing processes of a display device according to an embodiment of the present invention.

Next, examples of the third process shown in FIGS. 8A and 8B will be described. In the third process example, the process C in the first process example is not required, and not only the organic EL substrate 190 but also the underlying second film 180 are cut at the same time in the process B.

First, as shown in the drawing 8A, the first laser $L_1$ is irradiated from the first film 130 side to cut the first film 130. Since the process shown in FIG. 8A is the same as the process shown in FIG. 6A, repetitive descriptions are omitted.

Figure 8B:
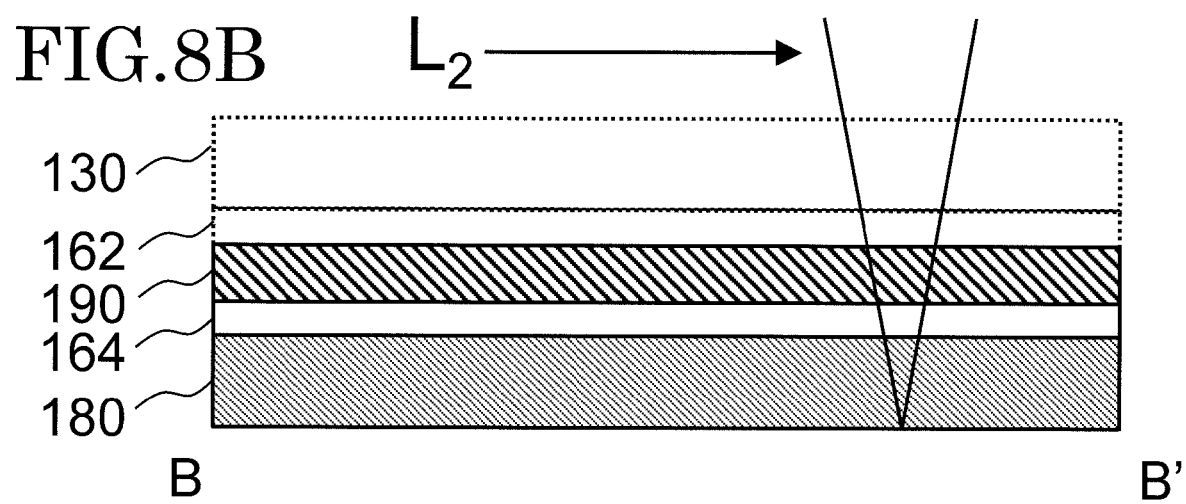

Next, as shown in FIG. 8B, the second laser $L_2$ is irradiated from the display region 120 side of the organic EL substrate 190 to cut the organic EL substrate 190 and the second film 180 thereunder at the same time.

When the cutting process shown in FIG. 8B is completed, the extra organic EL substrate 190 and the second film 180 located on the outer side of the second cutting line 154 are simultaneously removed to obtain the display device 100, which is shaped to the final product size shown in FIG. 5.

As described above, in the manufacturing methods of the display devices 100 and 300 according to an embodiment of the present invention, the process from the plurality of display devices have been manufactured collectively and then dividing or separating them into individual display devices to shaping them into final product size have been described referring to FIGS. 6A to 6C, FIGS. 7A to 7C, and FIGS. 8A and 8B. Here, the first to third process examples have been described, but the manufacturing process according to the present embodiment is not limited to these.

The embodiments described above as the embodiments of the present invention can be implemented in combination as appropriate as long as they do not conflict with each other. It is also within the scope of the present invention that a person skilled in the art adds, deletes, or changes designs of constituent elements, or adds, omits, or changes conditions of processes based on the display device of the respective embodiments and the manufacturing methods thereof as appropriate, as long as the gist of the present invention is provided.

In the present specification, although the organic EL display device is mainly exemplified as the embodiments, as other examples, any flat-panel display devices such as an electronic paper type display device having other self-luminous type display device, a liquid crystal display device, an electrophoretic device, or the like can be applied. The examples can be applied to small, medium or large display devices, regardless of their sizes.

It is to be understood that other effects different from those provided by the aspects of the embodiments described above, which are obvious from the specification herein, or which can be readily predicted by those skilled in the art, are provided by the present invention as a matter of course.

What is claimed is:

1. A method for manufacturing a display device comprising:
    forming an organic EL substrate by forming an organic EL layer on a first main surface of a flexible substrate;
    forming a terminal region in an end portion of the organic EL substrate; and
    covering a display region of the organic EL substrate with a film, cutting the film along a first cutting line by a first laser, and cutting the organic EL substrate along a second cutting line by a second laser, wherein the film has a taper region, the thickness increases with distance from the terminal region in a cross-sectional view; and the cutting end position is in a range of the taper region.

2. The method for manufacturing a display device according to claim 1, wherein the cutting start position of the film by the first laser is in a range of the taper region.

\* \* \* \* \*